United States Patent
Nakanishi et al.

[11] Patent Number: 6,104,057
[45] Date of Patent: Aug. 15, 2000

[54] ELECTRICALLY ALTERABLE NON-VOLATILE SEMICONDUCTOR MEMORY DEVICE

[75] Inventors: Hiroaki Nakanishi; Kunio Matsudaira; Masahiro Matsuo, all of Kobe; Hirohisa Abe, Sanda; Yoichi Sakai, Ibaraki, all of Japan

[73] Assignee: Ricoh Company, Ltd., Tokyo, Japan

[21] Appl. No.: 09/138,891

[22] Filed: Aug. 24, 1998

[30] Foreign Application Priority Data

Aug. 25, 1997 [JP] Japan .................................. 9-244614

[51] Int. Cl.$^7$ .................................................. H01L 29/76
[52] U.S. Cl. .......................... 257/314; 257/315; 257/316; 257/319; 257/320
[58] Field of Search .................... 257/213, 288, 257/304, 311, 314, 318, 319, 320, 326, 322, 365, 366, 315, 316

[56] References Cited

U.S. PATENT DOCUMENTS

| | | | |
|---|---|---|---|
| 5,614,746 | 3/1997 | Hong et al. | 257/316 |
| 5,691,939 | 11/1997 | Chang et al. | 257/316 |
| 5,717,237 | 2/1998 | Chi | 257/314 |
| 5,745,416 | 4/1998 | Shibata et al. | 257/315 |
| 5,752,952 | 5/1998 | Mehrad | 257/316 |
| 5,757,044 | 5/1998 | Kubato | 257/315 |
| 5,814,854 | 9/1998 | Liu et al. | 257/322 |
| 5,821,581 | 10/1998 | Kaya et al. | 257/322 |
| 5,834,806 | 11/1998 | Liu et al. | 257/316 |

*Primary Examiner*—Carl Whitehead, Jr.
*Attorney, Agent, or Firm*—Cooper & Dunham LLP

[57] ABSTRACT

An electrically alterable non-volatile memory device is disclosed. In the device architecture of the memory device, control gates are formed, divided corresponding to the blocks and interconnected independently within each block, to further be connected to a metal gate line through block select MOS transistors which are formed on a semiconductor substrate between the blocks. All gate electrodes of the block select MOS transistors which are connected to the control gates interconnected as above within each block are further connected each other. These block select transistors can be controlled by applying erase block signals such as, EBS0, EBS1 and so on, to respective transistors. In addition, the control gates are further connected to a decoder such that some of these control gates may be selected through metal control gate lines. With the block select transistors together with the metal control gate line provided as above, erasing can be achieved in the unit of memory cells which are connected to a metal control gate line within a block.

6 Claims, 3 Drawing Sheets

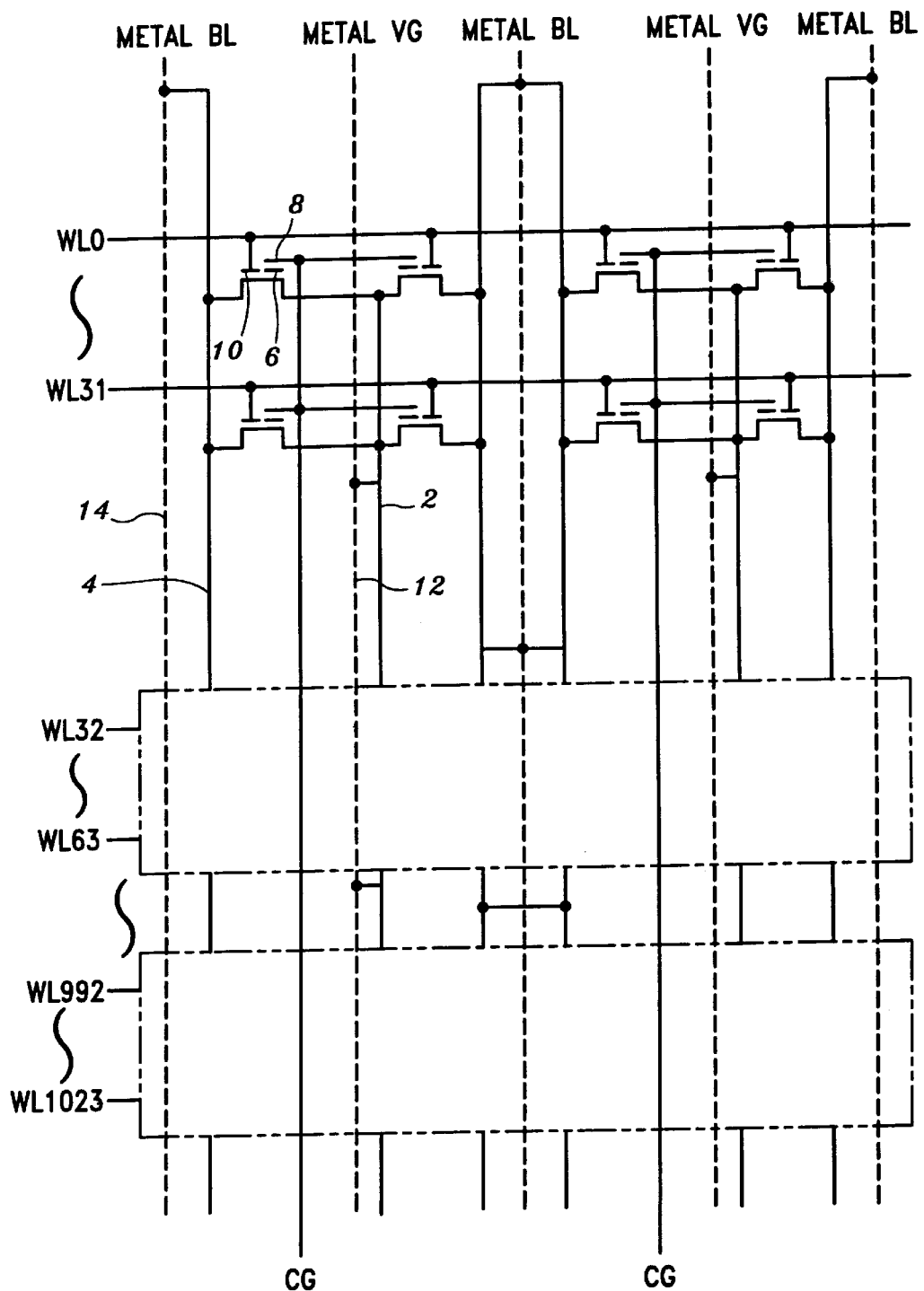
FIG. IA

ELECTRICALLY ALTERABLE NON-VOLATILE SEMICONDUCTOR MEMORY DEVICE

BACKGROUND OF THE INVENTION

1. Field of the Invention

This invention relates generally to an electrically alterable non-volatile memory device, such as an EEPROM and a flash memory, and, more specifically, to those types of devices employing split gate structures.

2. Description of the Related Art

Numerous electrically alterable non-volatile semiconductor memory devices such as EEPROMs (electrically erasable programmable read-only-memory) and flash memories have been developed.

Although erasing of EEPROMs is achieved electrically, one problem which occurs during an erase operation of the prior art EEPROM device, is that it cannot be over-erased. If a memory cell of the device is over-erased, it will become a depletion transistor, and it will conduct leakage current during reading of the other memory cells on the same access line. In order to overcome this problem in an ordinary EEPROM device, a memory cell is verified in a chip or in a bit to ensure that the over-erase condition does not occur. However, this necessitates an additional verification circuit and takes a relatively long time for the EEPROM device.

In one approach to overcome the above-mentioned disadvantages, a memory device is fabricated, including a floating gate formed between a control gate electrode and the surface of a semiconductor substrate, both of which are contiguous to a source region and a portion of a channel region and an addressing gate or select gate is formed on the channel region and extending to a portion of the channel region not covered by the floating gate and the control gate electrode. Due to the presence of the addressing gate, this device will not leak current even if the floating gate transistor is over-erased because the addressing gate can still turn off the device. The structure effectively includes a floating gate transistor and an addressing gate transistor in series and is referred to as a split gate structure.

For accomplishing the erasing, the memory cells are provided with a third gate or control gate. The control gate passes through each memory cell transistor closely adjacent to a surface of the floating gate but insulated therefrom by a dielectric layer. Charge is then removed from the floating gate to channel and drain regions of the cell, when appropriate voltages are applied to transistor elements, such as a drain region and control gate.

A plurality of memory cells are generally arranged in a matrix in conventional memory devices. In some instances, erasing can be carried out simultaneously for a significant group of, or the entire array of memory cells, which is referred to as a flash EEPROM memory array.

This is in contrast to prior EEPROMS which have additional gating devices for each cell and which are erased bit by bit. Rapid advancement in high integration has been accomplished primarily by this simultaneous erasing of the significant group of, or predetermined unit of memory cells of the flash EEPROMs. The unit is either a predetermined portion of the integrated device, which are hereinafter referred to as a 'block', or the entire portion of a memory device. The unit tends to be larger in size with the increase in the integration.

Since flash memory devices have been regarded as being used interchangeably with ultra-violet light erasable EPROMs until recently, the unit size during erasing has not been of the primary concern. However, as application fields of the flash memory expands it becomes more desirable for the unit size to be arbitrarily selected.

An example of a flash memory device is disclosed in U.S. Pat. No. 5,280,446, which teaches memory cells with a split-gate structure.

FIG. 1A is a schematic representation of a memory array described in the disclosure, and this array architecture is formed with a plurality of flash memory cells which have a triple layer polysilicon construction as illustrated in a cross sectional view of FIG. 1B.

In this array architecture, there are formed elongated source and drain diffusion layers 4 and 2 parallel to each other in a silicon substrate. A major surface of the substrate is first oxidized to form a tunnel oxide layer, and a first doped polysilicon layer is deposited thereon and defined to form a floating gate 6. The floating gate 6 is formed such that a portion thereof overlaps the drain diffusion layer 2 and is offset from the source diffusion layer 4 by a predetermined distance. A control gate 8 is further formed over the floating gate 6 and parallel to source and drain diffusion layers 4 and 2, having an underlying insulation layer.

In addition, an elongated select gate layer 10 is formed overlying the control gate 8 and portions of the substrate running perpendicular to source and drain layers 4 and 2, and having another underlying insulation layer. A select channel region is thereby defined as a portion of the channel region beneath the select gate 10 between the edge of the floating gate 6 and the source layer 4.

In the memory array architecture of FIG. 1A, the source and drain diffusion layers 4 and 2 are each formed by an elongated diffusion layer in common to a plurality of memory cells. Furthermore, since the drain diffusion layers 2 in this example are formed in common to each pair of neighboring memory cells, this amounts to 2028 drain diffusion layers formed in common, while 1028 source diffusion layers 4 are formed in common to memory cells of one side of the neighboring cells.

In addition, the drain diffusion layer 2 is connected to a metal virtual ground (VG) line 12 via a contact hole, and the source diffusion layer 4 is connected to a metal bit line 14 via another contact hole.

Since a plurality of the control gates 8 are formed extending parallel to the direction of the diffusion layers 4 and 2 and being in common to the both side of the drain diffusion layer 2, this amounts to 2028 control gates formed in common and connected to one another.

A plurality of the select gates 10 are formed extending perpendicular to the direction of the diffusion layers 2 and 4, and are interconnected to form a plurality of word lines (WL).

In the memory array of FIG. 1, a plurality of the select gates 10 are formed extending perpendicular to the control gate 8 so that the source and drain diffusion layers 4 and 2 of a plurality of memory cells can be formed in common as mentioned-above, and the number of contacts between the diffusion layers 2, 4 and the metal lines 12, 14 may be reduced, to thereby accomplish the increase in the integration density of the memory device.

In the memory device in the above example, erasing is carried out by applying a negative voltage to the control gate 8 and a positive voltage to the drain diffusion layer 2.

The unit of, or the size of the memory array for which erase operations are carried out has been determined generally by the manner in which control gates are shared in the memory array. That is, a plurality of memory cells which share one single control line are erased simultaneously. For example, 2048 memory cells are simultaneously erased in the above-mentioned memory array.

The size of the unit during erasing in a prior art memory array has neither been selected arbitrarily, nor had enough flexibility for the selection.

SUMMARY OF THE INVENTION

The general purpose of this invention is therefore to provide improved memory device structures, having most, if not all, of the advantages and features of similar employed related structures, while eliminating many of the aforementioned disadvantages of other related structures.

Accordingly, one object of this invention is to overcome the above-described limitations on selecting the unit in the memory device and to adjust the size of the unit arbitrarily during erase operations. This and other objects are addressed by the present invention.

In one embodiment of the invention, a semiconductor memory device is provided, including first and second elongated memory diffusion layers formed in a silicon substrate, spaced apart and running parallel to each other, so as to serve as drain diffusion and source diffusion regions, respectively;

an underlying first dielectric layer or tunnel oxide layer formed on a major surface of the substrate, floating gates of a first conductive material formed thereon, such that each of floating gates is contiguous to one of the first elongated memory diffusion layers, offset from one of the second diffusion layer by a predetermined distance, and isolated from each other, control gates of a second conductive material formed over the floating gates, having underlying insulation layers, each of which is defined to be in common to a plurality of memory cells and running parallel to the first and second memory diffusion layers; and select gates of a third conductive material formed in the regions over the floating gate, having a third insulation layer, and on the substrate region between the floating gate and the second diffusion layer, having an underlying insulation layer, each of which is to be in common to a plurality of cells and running perpendicular to the control gates, whereby memory cells are formed as a split gate type of cells which have memory channels situated in the surface region of the substrate beneath the floating gates, and their select channels situated in the surface of the substrate between the second diffusion layers and floating gates.

A memory array of the present invention is subsequently formed by arranging these memory cells in a matrix, wherein the memory cells are divided into a plurality of blocks such that memory cells in each block are connected to one control gate which is previously divided corresponding to the blocks and then connected to a common metal control gate via a block select transistor. A plurality of the block select transistors are interconnected independently within the block for erase block signals be applied in common within the block.

By means of the application of erase block signals and the selection of the metal control gate, erasing can be achieved in the unit of the memory cells which are connected to a metal control gate line within the block.

As mentioned above, since control gates are each divided corresponding to the blocks and interconnected independently within each of the blocks, and further connected to respective block select transistor, these control gates which belong to specific blocks and also to a metal control gate line can be selected by applying negative voltages to corresponding select block transistors during the erase operations.

Among the aforementioned first and second memory diffusion layers, those which are connected to a sense amplifier during a read operation are formed preferably so as to be divided corresponding to the block independently within each block and connected to a common metal bit line in common to a plurality of blocks via a block select transistor.

Whereas those which are not connected to a sense amplifier may also be divided corresponding to the block independently within each block and connected to a metal bit line in common to a plurality of blocks.

BRIEF DESCRIPTION OF THE DRAWINGS

The present invention together with its various features and advantages, can be more easily understood from the following more detailed description taken in conjunction with the accompanying drawings in which:

FIG. 1A is a schematic representation of a background memory array including a plurality of flash memory cells;

DESCRIPTION OF THE ILLUSTRATIVE EMBODIMENTS

Figure 1B:
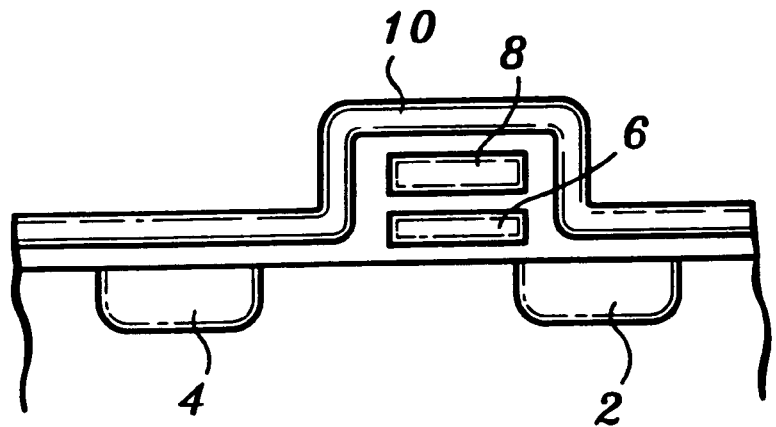
FIG. 1B is a cross sectional view of a background flash memory cell, having a triple layer polysilicon construction, included in the memory array of FIG. 1A.
Figure 2B:
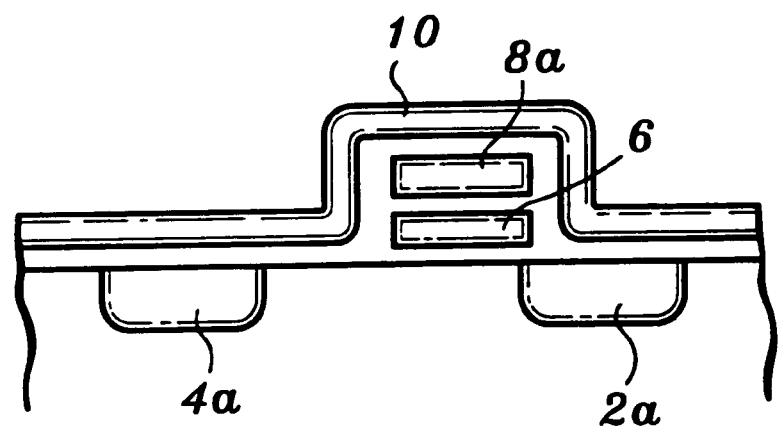
FIG. 2B is a cross sectional view of a flash memory cell, having a triple layer polysilicon construction, included in the memory array of FIG. 2A.
Figure 2A:
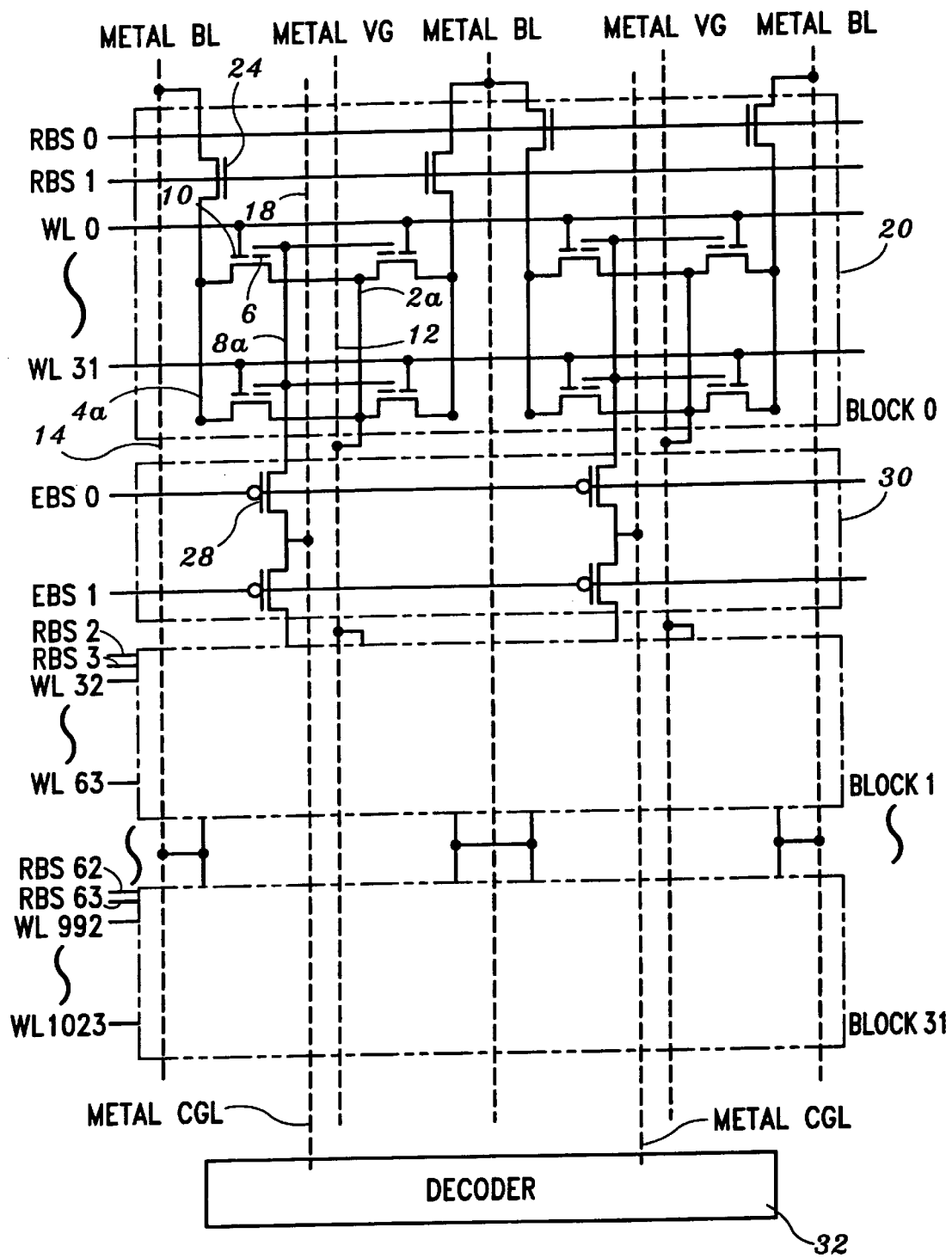
FIG. 2A is a schematic representation of a memory array including a plurality of flash memory cells in accordance with one embodiment of the present invention.

FIG. 2A is a schematic representation of a memory array according to one embodiment of the present invention, and this array architecture is formed with a plurality of flash memory cells each of which has a triple layer polysilicon construction as illustrated in a cross sectional view of FIG. 2B. In FIG. 1A through 2B, like reference numerals refer to like or similar elements.

Referring to FIG. 2B, first and second elongated memory diffusion layers are formed to serve as drain diffusion 2a and source diffusion regions 4a, respectively, running parallel to each other in a silicon substrate.

A major surface of the substrate is oxidized to form a first dielectric layer or tunnel oxide layer, and a first conductor layer of doped polysilicon is deposited thereon and then defined to form a floating gate 6, situated over the portions between the first and second memory diffusion layers.

The floating gate 6 is formed so as to be isolated in each memory cell, and for a portion thereof to overlap the source diffusion region 2a and to be offset from the source diffusion region 4a by a predetermined distance.

A second conductor layer of doped polysilicon is formed over the floating gate 6, having an underlying insulation layer, to serve as a control gate 8a which is in common to a plurality of memory cells and running parallel to the drain and source diffusion layers 2a and 4a.

A third conductor layer of doped polysilicon is further formed on the substrate between the floating gate 6 and the source diffusion region 4a, having an underlying gate dielectric layer. This third conductor layer is then defined to serve as a select gate 10 which is formed in common to a plurality of memory cells and extending perpendicular to the pair of memory diffusion layers 2a and 4a over the control gate 8. The select gates 10 are used as word lines WL0 through WL1023.

In the present construction, the memory cell is thus formed as a split gate memory cell which has its memory channel and select channel, situated in the surface portion of the substrate beneath the floating gate, and between the source diffusion region 4a and floating gate 6, respectively. A memory array of the present invention is then formed by arranging these memory cells into a matrix.

A plurality of the memory cells in the memory array are divided into a plurality of blocks 20 which are designated by the areas surrounded by chain lines in FIG. 2A and each of which includes, for example, 32 word lines in this embodiment.

Control gates 8a in the array are also divided corresponding to the blocks 20 and interconnected within each block. In addition, the memory array is further provided with block select circuits 30 which are formed between the blocks on the substrate, comprising block select MOS transistors 28 and being designated by another group of chain lines also in FIG. 2A.

The control gates 8a which are divided and interconnected as above are then connected to a metal control gate line 18 via block select MOS transistors 28. Although P-channel MOS transistors are used as the block select MOS transistors 28 in the present embodiment, N-channel MOS transistors may also be used for the circuit.

As aforementioned, a plurality of the control gates 8a are divided into blocks, each of which includes 32 word lines. Since the control gates 8a are formed in common to memory cells which belong to one single block, and the block includes 32 pairs of neighboring memory cells (FIG. 2A), this amounts to 64 memory cells which are connected to one control gate line.

Also, as mentioned above, the control gates 8a are connected to a metal control gate line 18 via block select MOS transistors 28. Therefore, all of the gate electrodes of block select MOS transistors 28 are interconnected, which belong to this block and which are connected, in turn, to the control gate 8a. To these block select transistors, erase block signals such as, EBS0, EBS1 and so on, are supplied to control the block select transistors 28.

The metal control gate line 18 is further connected to a decoder 32 such that some of the metal control lines 18 may be selected. With the block select transistors 28 together with the metal control gate line 18 provided as described above, erasing can be achieved in the unit of memory cells which are connected to a metal control gate line within a block.

Drain diffusion layers 2a in the array are divided corresponding to the blocks 20 and connected to the metal virtual ground (VG) line in common to a plurality of the blocks. Since the drain diffusion layer 2a are shared by memory cells which belong to one single block and the block includes 32 pairs of neighboring memory cells, the number of memory cells which are connected to each drain diffusion layer amounts to 64.

Source diffusion layers 4a in the array are also divided corresponding to the blocks 20 and connected to the metal bit line 14 via block select transistors 24. Since the source diffusion layers 4a are formed in common to memory cells which belong to one single block and connected to 32 word lines, the number of memory cells which are connected to each source diffusion layer 4a amounts to 32.

As aforementioned, the drain diffusion layers 2a are formed in common to 64 memory cells which belong to one single block and which constitutes 32 pairs of neighboring memory cells.

By contrast, the source diffusion layers 4a mentioned just above are connected in common to 32 memory cells to form a first group of interconnected source diffusion layers. Furthermore, 32 other source diffusion layers are also connected in common to 32 memory cells to form a second group of interconnected source diffusion layers. As shown in FIG. 2A, it is noted that the first and second groups of source diffusion layers are related to 64 memory cells which share drain diffusion layers within the above-mentioned block. It is also noted the first and second groups are connected further to block select transistors 24, of which gate electrodes are connected to gate line RBS 1.

In a similar manner, other groups of 32 source diffusion layers, such as third and fourth groups, for example, may be formed, such that the third and fourth groups are connected to the next 64 memory cells which share drain diffusion layers within the block, and are connected further to block select transistors 24, of which gate electrodes are connected to gate line RBS 2, but not to RBS 1 (FIG. 2A).

In order to control the block select transistors 24, read block signals are applied to gate electrodes of the transistors 24 through the lines such as, RBS0, RBS1 and so on. With the block select transistors 24 thus provided, the reduction of diffusion capacitance associated with metal bit lines 14 can be achieved, thereby accomplishing the increase in the read out speed for the memory device.

As aforementioned, drain diffusion layers 2a are divided corresponding to the blocks 20 and connected to the metal virtual ground (VG) line via contact holes. There is no block select transistor connected between the memory cells and the metal virtual ground (VG) line 12.

With this construction of the memory array, erasing is carried out as follows. A negative voltage is applied to the metal control gate line 18. Among the block transistors 28, only those which are selected by the block select signals (EBS) are turned on. Subsequently, among the memory cells, only those cells are erased that belong to the block of which control gates of the memory cells are connected to the above on-state transistors 28.

Although the source diffusion layers are formed separately for each pair of memory cells in the word line direction in the present embodiment, they may also be formed so as to be shared between paired memory cells.

In addition, although the drain diffusion layers are formed so as to be shared between paired memory cells in the word line direction, they may also be formed separately for each of pairs of the memory cells.

Furthermore, although the source and drain diffusion layers are formed so as to be divided in a block, they may also be formed in common to some of the plurality of blocks.

In the memory array architecture of the present invention, as described above, control gates are each divided corresponding to the blocks and interconnected within each block, and further connected to respective block select transistors. The selection of memory cells during erasing can therefore be accomplished in the unit of memory cells which are connected to a metal control gate within a block by properly decoding negative voltages and applying to the corresponding select block transistors.

In addition, among the first or second memory diffusion layers, those which are connected to a sense amplifier during reading operations are divided corresponding to the blocks to further be connected to a metal bit line through respective block select transistors. Since memory diffusion layers to be connected to the metal bit line are therefore arbitrarily selected in the present architecture, diffusion capacitance associated with metal bit lines can be reduced, thereby resulting in an increase in the read out speed for the memory device.

Furthermore, also in the present architecture, among the first or second memory diffusion layers, both diffusion layers which are connected, and not connected to a sense amplifier during reading operations, are divided corresponding to the blocks and interconnected independently within each block. Therefore, the aforementioned limitations on selecting the unit can be lifted to thereby be able to adjust arbitrarily the size of the unit during erase operations in the present architecture of the memory device.

Additional modifications and variations of the present invention are possible in light of the above teachings. It is therefore to be understood that within the scope of the appended claims, the invention may be practiced otherwise than as specifically described herein.

This case claims priority on Japanese document 9-244614 filed Aug. 25, 1997 in Japan, the entire contents of which are hereby incorporated by reference.

What is claimed is:

1. An electrically alterable non-volatile memory device including a memory matrix comprising a plurality of memory cells, each of said memory cells comprising:

a semiconductor substrate of a first conductivity type;

first elongated memory diffusion layers of a second conductivity type formed in said semiconductor substrate so as to serve as drain regions of said memory cells;

second elongated memory diffusion layers of a second conductivity type formed in said semiconductor substrate so as to serve as source regions of said memory cells, each of said second memory diffusion layers running parallel with each of said first elongated memory diffusion layers;

a first insulating layer formed on the entire surface of said semiconductor substrate;

floating gates of a first conductive material formed on said first insulating layer, such that each of said floating gates is contiguous to one of said first elongated memory diffusion layers, and is offset from one of said second elongated memory diffusion layers by a predetermined distance, said floating gates for respective memory cells being isolated from each other;

second insulating layers formed on said floating gates, being isolated from each other;

control gates of a second conductive material formed on said second insulating layer so as to be in common to a plurality of said memory cells and running parallel to said first and second elongated memory diffusion layers;

a third insulating layer formed on the entire surface of said semiconductor structure;

select gates of a third conductive material formed on said third insulation layer and in the regions over said floating gate and on said semiconductor substrate region between said floating gate and said second elongated memory diffusion layers, said select gates being in common to a plurality of said memory cells and running perpendicular to said control gates;

said memory cells being formed as a split gate type of cells, each having surface regions of said semiconductor substrate, such as beneath the floating gates which serves as a memory channel, and between said second memory diffusion layers and floating gates which serves as a memory channel, wherein said memory cells are divided into a plurality of blocks such that said memory cells in each of said blocks are connected to one of said control gates which are previously divided corresponding to said blocks and further connected to a common metal control gate through a block select transistor, and a plurality of said block select transistors are interconnected independently within said block for erase block signals applied in common within said block, whereby erasing becomes feasible in the unit of said memory cells which are connected to a metal control gate line within said block, by means of the application of erase block signals and the selection of said metal control gate.

2. The electrically alterable non-volatile memory device of claim 1, wherein, among said first and second elongated memory diffusion layers, those connected to a sense amplifier during reading operations are divided corresponding to the blocks and connected to a metal bit line in common to a plurality of blocks.

3. The electrically alterable non-volatile memory device of claim 1, wherein, among said first or second elongated memory diffusion layers, those which are not connected to a sense amplifier during reading operations are divided corresponding to the blocks and connected to a metal bit line in common to a plurality of said blocks.

4. An electrically alterable non-volatile memory device including a memory matrix comprising a plurality of memory cells, each of said memory cells comprising:

a semiconductor substrate of a first conductivity type;

first elongated memory diffusion layers of a second conductivity type formed in said semiconductor substrate so as to serve as drain regions of said memory cells;

second elongated memory diffusion layers of a second conductivity type formed in said semiconductor substrate so as to serve as source regions of said memory cells, each of said second memory diffusion layers running parallel with each of said first elongated memory diffusion layers;

a first insulating layer formed on an entire surface of said semiconductor substrate;

floating gates of a first conductive material formed on said first insulating layer, such that each of said floating gates is contiguous to one of said first elongated memory diffusion layers, and is offset from one of said second elongated memory diffusion layers by a predetermined distance, said floating gates for respective memory cells being isolated from each other;

second insulating layers formed on said floating gates, being isolated from each other;

control gates of a second conductive material formed on said second insulating layer so as to be in common to a plurality of said memory cells and running parallel to said first and second elongated memory diffusion layers;

a third insulating layer formed on the entire surface of said semiconductor structure;

select gates of a third conductive material formed on said third insulation layer and in the regions over said floating gate and on said semiconductor substrate region between said floating gate and said second elongated memory diffusion layers, said select gates being in common to a plurality of said memory cells and running perpendicular to said control gates;

said memory cells being formed as a split gate type of cell, each having the surface regions of said semiconductor substrate, such as beneath the floating gates which serves as a memory channel, and between said second memory diffusion layers and floating gates which serves as a memory channel, wherein said memory cells are divided into a plurality of blocks such that said memory cells in each of said blocks are connected to one of said control gates which are previously divided corresponding to said blocks and further connected to a common metal control gate through a block select transistor, and a plurality of said block select transistors are interconnected independently within said block for erase block signals applied in common within said block, whereby erasing becomes feasible in the unit of said memory cells which are connected to a metal control gate line within said block, by means of the application of erase block signals and the selection of said metal control gate.

5. The electrically alterable non-volatile memory device of claim 4, wherein, among said first or second elongated memory diffusion layers, those which are not connected to a sense amplifier during reading operations, are divided corresponding to the blocks and connected to a metal bit line in common to a plurality of said blocks.

6. An electrically alterable non-volatile memory device including a memory matrix comprising a plurality of split gate type of memory cells, comprising:

a plurality of split gate type of memory cells, each including a control gate, a floating gate, a select gate, a drain and a source, the plurality of split gate type of memory cells being divided into a plurality of blocks such that said memory cells in each of said blocks are connected to one of said control gates which are previously divided corresponding to said blocks and further connected to a common metal control gate through a block select transistor, and a plurality of said block select transistors are interconnected independently within said block for erase block signals applied in common within said block, whereby erasing becomes feasible in the unit of said memory cells which are connected to a metal control gate line within said block, by means of the application of erase block signals and the selection of said metal control gate.

* * * * *